United States Patent [19]

Rathmell et al.

[11] Patent Number: 5,383,269
[45] Date of Patent: Jan. 24, 1995

[54] METHOD OF MAKING THREE DIMENSIONAL INTEGRATED CIRCUIT INTERCONNECT MODULE

[75] Inventors: Claude Rathmell; Carroll S. Vance; David W. Barnes; Seyed H. Hashemi, all of Austin, Tex.

[73] Assignee: Microelectronics And Computer Technology Corporation, Austin, Tex.

[21] Appl. No.: 114,865

[22] Filed: Sep. 2, 1993

Related U.S. Application Data

[60] Continuation of Ser. No. 958,974, Oct. 9, 1992, abandoned, which is a division of Ser. No. 753,504, Sep. 3, 1991, abandoned.

[51] Int. Cl.$^6$ ............................................. H05K 3/36
[52] U.S. Cl. ....................................... 29/830; 29/856; 437/205; 437/209
[58] Field of Search ................. 29/830, 825, 854, 856; 437/205, 209; 264/102

[56] References Cited

U.S. PATENT DOCUMENTS

| | | | |
|---|---|---|---|
| 2,907,924 | 10/1959 | Lutton . | |
| 3,345,344 | 10/1967 | Fetscher et al. | 260/78.4 |
| 3,705,332 | 12/1972 | Parks | 361/414 |
| 3,746,934 | 7/1973 | Stein . | |
| 4,103,318 | 7/1978 | Schwede | 361/388 |
| 4,355,463 | 10/1982 | Burns | 29/827 |
| 4,466,183 | 8/1984 | Burns | 29/827 |
| 4,480,067 | 10/1984 | Vio et al. | 524/446 |
| 4,525,921 | 7/1985 | Carson et al. . | |
| 4,532,046 | 7/1985 | Meunier et al. | 210/698 |
| 4,536,296 | 8/1985 | Vio | 252/8.5 |
| 4,560,826 | 12/1985 | Burns et al. | 174/52 |
| 4,587,300 | 5/1986 | Vio et al. | 525/354 |
| 4,630,172 | 12/1986 | Stenerson et al. . | |
| 4,767,540 | 8/1988 | Spitzer et al. | 210/728 |
| 4,862,249 | 8/1989 | Carlson . | |
| 4,862,588 | 9/1989 | MacKay | 29/884 |
| 4,868,712 | 9/1989 | Woodman | 361/396 |
| 4,884,237 | 11/1989 | Mueller et al. | 365/63 |
| 4,902,751 | 2/1990 | Lewellyn et al. | 525/340 |
| 4,953,060 | 8/1990 | Lauffer et al. | 361/396 |
| 4,991,290 | 2/1991 | McKay | 29/884 |
| 5,013,249 | 5/1991 | Lindeman et al. | 439/66 |
| 5,016,138 | 5/1991 | Woodman | 361/396 |
| 5,028,986 | 7/1991 | Sugano et al. . | |
| 5,036,431 | 7/1991 | Adachi et al. . | |
| 5,065,277 | 11/1991 | Davidson | 361/412 |
| 5,099,928 | 3/1992 | Bouchut et al. | 175/57 |
| 5,128,420 | 7/1992 | Domb et al. | 525/377 |
| 5,279,029 | 1/1994 | Burns | 29/856 |

OTHER PUBLICATIONS

Emory Garth, "Memory System-An Ultimate In Packaging Technology", Electro 78 Conference, Boston, Mass., pages unknown, 23 May 1978.

Shankar et al. in Bull. Mater. Sci.; vol. 10; pp. 423-433 (1988).

Clauss et al. in Int. J. Miner. Proc.; vol. 3; p. 27 (1976).

Schmieg, "DIP Storage Module With Stacked Chips," IBM Technical Disclosure Bulletin, vol. 23, No. 6, p. 2337, Nov. 1980.

"3-D Memory Module," Irvine Sensors Corporation, Sep., 1989.

"Short Form Catalog-1991," Dense Pac Microsystems, Inc., 1991.

"Stacked Chips=More Memory," Design News, Mar. 25, 1991, p. 186.

Brochure, Conductive Circuit Corp.

Balde, "Multichip Modules: The Constructions in Use Today," Proceedings of the Technical Program of the National Electronic Packaging and Production Conference, NEPCON West '90 pp. 965-974.

(List continued on next page.)

Primary Examiner—Carl J. Arbes
Attorney, Agent, or Firm—Fulbright & Jaworski

[57] ABSTRACT

A three dimensional integrated circuit interconnect for connecting a plurality of chips in a module with a standard footprint for pin grid array or quad flat pack mounting. Each IC is mounted on a custom interconnect slice and tested. The slices are stacked together with electrical connections from one slice layer to the next. The module may use multi-layer ceramic slices or printed circuit board materials.

9 Claims, 4 Drawing Sheets

OTHER PUBLICATIONS

Torku et al., "Quality Level and Fault Coverage For Multichip Modules," *IEEE 20th Design Automation Conference,* Paper 15.2, 1983, pp. 201–206.

Hagge, "Mechanical Considerations For Reliability Interfaces In Next Generation Electronics Packaging," *Proceedings of the IEEE 1989 National Aerospace and Electronics Conference,* 1989, pp. 201–206.

D. Stys et al., "A Study of Electrical Performance for Next Generation Instic Packages," *IEEE-CHMT 41st Conference,* May, 1991, pp. 278–282.

Quint et al., "Measurements of R, L, and C Parameters in VLSI Packages" *Hewlett-Packard Journal,* Oct., 1990, p. 73.

Choksi et al., "Computer Aided Electrical Modeling of VLSI Package" *Electronic Components and Technology Conference,* 1990, pp. 169–170.

Adams, "Chasing the Elusive Gigaflop In a Soup Can," *Military and Aerospace Electronics,* Feb. 1991, pp. 26–29.

Goldmann, "Universal Electronic Package", IBM Technical Disclosure Bulletin, vol. 27, No. 6, Nov. 1984, pp. 3335–3336.

METHOD OF MAKING THREE DIMENSIONAL INTEGRATED CIRCUIT INTERCONNECT MODULE

This is a continuation of application Ser. No. 07/958,974, filed Oct. 9, 1992, which is a division of Ser. No. 07/753,504, filed Sep. 3, 1991, both abandoned.

BACKGROUND OF THE INVENTION

The present invention is directed to a three dimensional integrated circuit (IC) interconnect module by providing a fully interconnected module with a plurality of chips. One or more chips are mounted on a separate slice, each slice is individually tested, and the slices are assembled by stacking them one on top of another. This module approach will produce a low cost, moderate performance package which will hold an entire chip set and may have a standard pin grid array (PGA) or quad flat pack footprint for mounting on a printed circuit board.

The method of manufacturing allows each component to be tested individually after mounting and prior to assembly. It provides for the interconnect leads to be accessible for testing and provides an assembly check test method for testing during the manufacturing process. The manufacturing process should provide an extremely high yield module, and the finished module allows testing using traditional approaches.

SUMMARY

The present invention is directed to a three dimensional IC module which includes a plurality of vertically stacked slices. Each slice includes at least one integrated circuit having a plurality of input/output pads and a lead interconnect electrically connected to each pad. A plurality of signal connections extend transversely through the inside of all of the slices and surrounds the integrated circuit, and one of the connections are connected to each of the lead interconnects. This structure provides shorter connecting lines with lower parasitics because the connections are made closely adjacent to the integrated circuits.

An object of the present invention is wherein the slices are ceramic and the signal connections are stacked in aligned metal filled vias which are connected together to form the signal connections.

Still a further object is wherein the lead connects include a film strip position between slices providing an electrical interconnection between the vias and the pads.

In another form of the invention, each slice includes a middle layer having at least one integrated circuit with a plurality of input/output pads and a lead interconnect electrically connected to each pad, a metallic layer adjacent one side of the middle layer for supporting the middle layer and providing a heat spreader, and an encapsulation layer adjacent to second side of the middle layer. The middle, metallic and encapsulation layers include a plurality of openings within the layers and surrounding the integrated circuits. A plurality of signal pins are provided, each of which extend through an opening in each layer and through the slices. One end of the pin is connectable to an electronic component and one of the pins is electrically connected to each of the lead interconnects, but are insulated from the metallic layer. Preferably the encapsulation layer includes a recess mating with the integrated circuit for receiving a sealant. Preferably the signal pins pass through the metallic layer without making electrical contact by being smaller than the openings in the metallic layer. Some of the signal pins may provide an electrical connection between integrated circuits in different slices. Preferably the middle layer extends inwardly closer to the signal pins than the other layers for ease of electrical connection therebetween.

Yet a still further object of the present invention is a method of making a three dimensional IC interconnect module which includes making a plurality of slices having at least one integrated circuit with a plurality of input/output pads and a lead interconnect electrically connected to each pad. The lead interconnects terminate at various locations within the periphery of the slices and surround the integrated circuits. The method includes testing each slice individually for testing the integrated circuits and the lead interconnects prior to assembly. The method thereafter includes stacking the slices together and then aligning a plurality of signal connections extending transversely through the plurality of slices within the periphery of the slices and surrounding the integrated circuits, electrically connecting the lead interconnects to the signal connections, and testing the stacked slices through the signal connections.

The method further includes providing a plurality of openings in each slice in which one of the openings is positioned adjacent to the termination of each lead interconnect and providing a plurality of parallel extending signal connection pins, and stacking the slices together by inserting the openings over the pins. Preferably the method includes electrically connecting the lead interconnects to the pins by heating the pins and soldering the interconnects and pins together. Preferably the testing step includes testing each slice individually by first testing only the lead interconnects and thereafter testing the combination of lead interconnects and integrated circuits.

Another object of the present invention is providing a plurality of solder filled openings in each slice, one of said openings positioned adjacent the termination of each lead interconnect, and heating the stacked together slices for connecting the solder filled openings together forming the signal connections.

In one form of the invention the slices are ceramic and the lead interconnects are formed by placing a film of interconnect circuitry between ceramic slices.

Yet in another form of the invention, the slices are formed by assembling a bottom metallic layer, a middle layer having an integrated circuit with a plurality of input/output pads and a top encapsulation layer. Also, openings are provided in all of the layers within their periphery and surrounding the integrated circuits.

A still further object of the present invention is wherein the integrated circuits have input protection diodes at each pad and the testing includes applying a negative voltage to each of the lead interconnects when testing each slice, and measuring the current drawn for each of the interconnects.

Other and further objects, features and advantages will be apparent from the following description of presently preferred embodiments of the invention, given for the purpose of disclosure, and taken in conjunction with the accompanying drawings.

DESCRIPTION OF THE PREFERRED EMBODIMENTS

Figure 6:
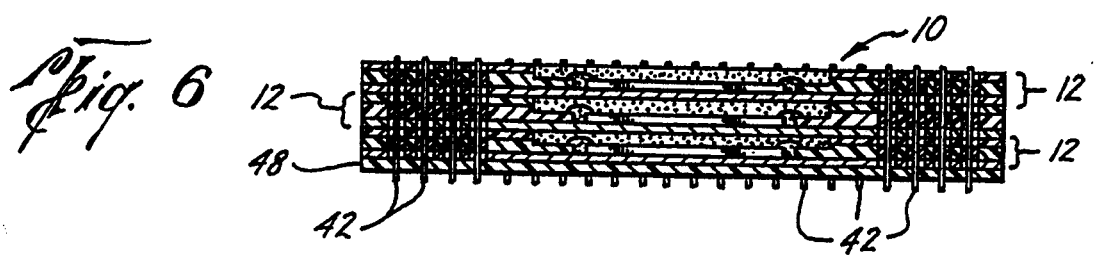
FIG. 6 is a cross-sectional view of a plurality of slices of FIG. 5 stacked upon a base plate with signal connection pins to form a module.

Referring now to the drawings and particularly to FIG. 6, one embodiment of the present invention is shown generally indicated by the reference 10 which generally uses standard printed circuit board materials and provides a standard PGA footprint mounting of the package on a printed circuit board. The three dimensional IC module 10 of the present invention includes a plurality of slices generally indicated by the reference 12 here shown as three slices for convenience although any suitable number may be utilized.

Figure 3:
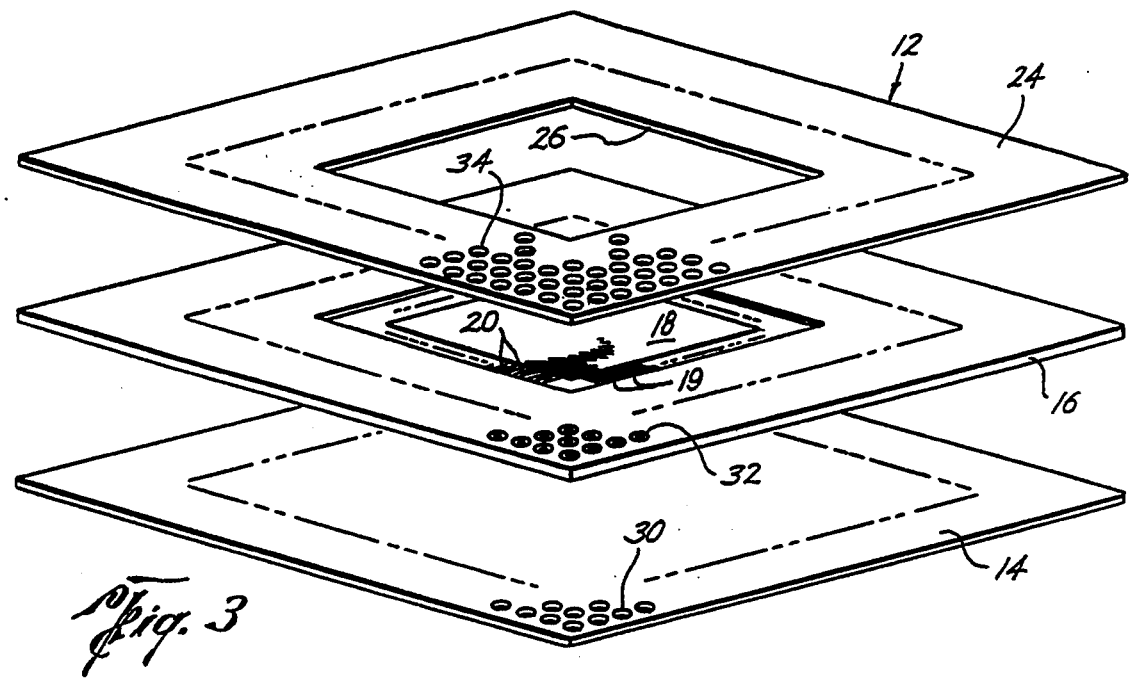
FIG. 3 is an exploded isometric view of the three layers of one slice of FIG. 2.
Figure 4:
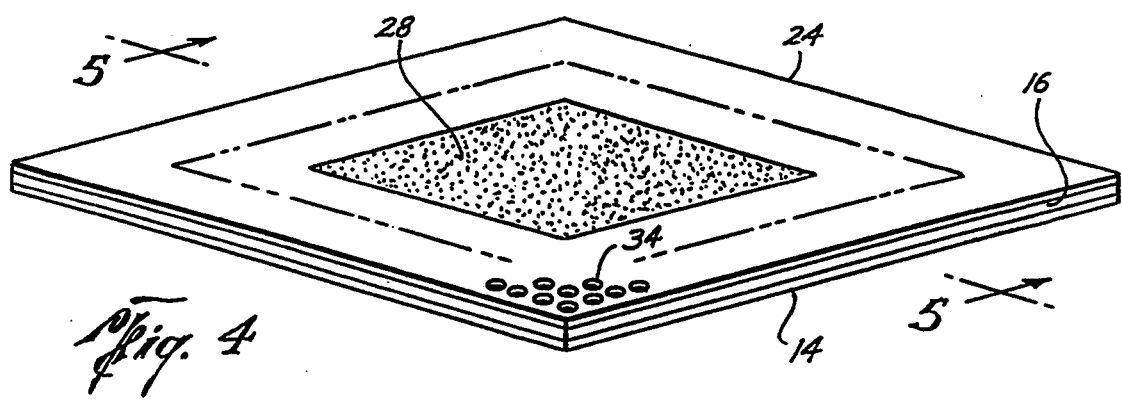
FIG. 4 is an isometric view of the layers of FIG. 3 stacked into one slice with the addition of a sealant.
Figure 5:
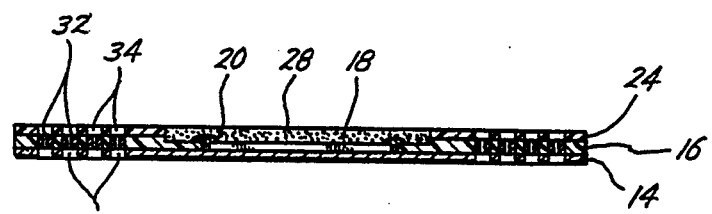
FIG. 5 is a cross-sectional view taken along the line 5—5 of FIG. 4.

Referring now to FIG. 3, an exploded view of one of the slices 12 is best seen which may include a bottom metallic layer 14 such as alumina for acting as a support and a heat sink, a middle layer 16 having at least one integrated circuit die 18 which includes a plurality of input/output pads 20 and a plurality of lead interconnects 19, one electrically connected to each pad 20, and an encapsulation layer 24 which preferably includes a window 26 adjacent the IC die 18 for receiving a suitable sealant such as silicone gel 28 (FIGS. 4 and 5).

Figure 1:
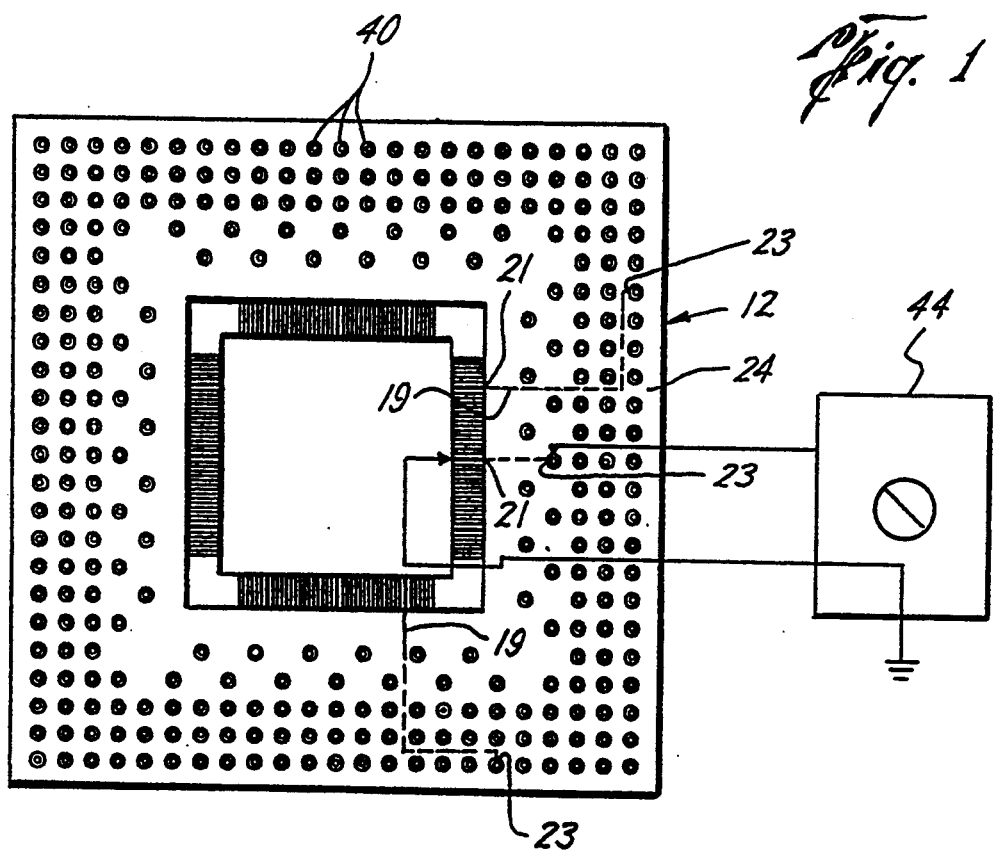
FIG. 1 is an elevational view of one slice of one embodiment of the present invention without the integrated circuit and schematically illustrating testing the lead interconnects.
Figure 2:
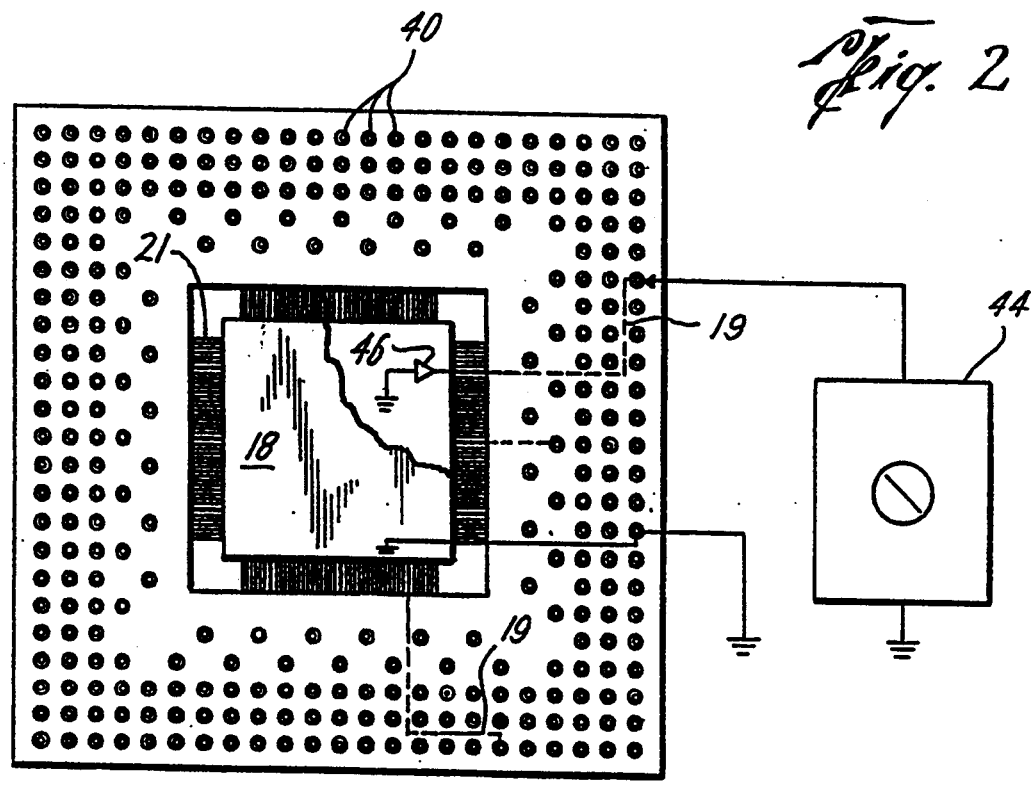
FIG. 2 is an elevational view similar to FIG. 1 but with the integrated circuit die installed.

A plurality of openings 30, 32, and 34 are provided in each of the layers 14, 16 and 24, respectively. The openings 30, 32 and 34 are coaxially aligned with each other when the layers 14, 16 and 24 are assembled together to form a plurality of openings through each layer 12 for receiving a plurality of signal connections. As best seen in FIGS. 1 and 2 the openings 40 and thus signal connections 42 (FIG. 6) are positioned within the outer periphery of the slices 12, surround the integrated circuits 18, and are positioned as closely as possible to the integrated circuits 18. As will be described, since the signal connections 42 are connected to lead interconnects 19 and thus to one of the pads 20 on the integrated circuits 18 the particular configuration shown is highly advantageous. First, the lines of connection between the signal connections 42 and the pads 20 are short, the ensuing capacitance is a minimum, the signal rise time is short, and easier and quicker testing of the various components can be accomplished since each of the pads 20 is directly connected to one of the signal connections 42. It is further to be noted that the signal connections 42 match the footprint of a PGA package and thus can be conventionally mounted with other electronic components. Also, because of the arrangement shown a high density module may be provided in a small package.

The significant challenges involved in testing conventional multi-chip modules may be overcome with the present module 10 as each component may be tested individually during the assembly process. Referring now to FIG. 1, one assembled slice 12 is shown minus the integrated circuit die 18. The lead interconnects 19 (shown as dotted lines) are custom fabricated in the printed circuit board layer 16 (beneath layer 24) having first ends 21 surrounding the space for insertion of the integrated circuit die 18 and second ends 23 positioned adjacent one of the openings 40. Only a few of the lead interconnects 19 are illustrated, but each lead interconnect 19 would lead from one of the pads 20 of integrated circuit 18 to one of the openings 40 for connection to a signal connection 42, either to be interconnected to other integrated circuits 18 on other slices 12 or brought to the lowest slice 12 which provides the connections to another electronic component. In FIG. 1 an electrical test apparatus 44 is shown testing the electric continuity of each of the lead interconnects 19 before the slice 12 is fully assembled.

And referring to FIG. 2, the integrated circuit 18 is connected in place and the pads 20 (FIG. 3) are electrically connected to the ends 21 of the lead interconnects 19 by any suitable means such as either TAB bonding or conventional wire bonding. At this stage the testing apparatus 44 may again be used to test the individual slice 12 to determine if any fault exists in the integrated circuit 18, the bonding between the integrated circuit 18 and the lead interconnection 19, or again in the lead interconnections 19. Of course, the testing step illustrated in FIG. 1 may be omitted, but it provides an additional testing method for isolating any faults detected in the testing step shown in FIG. 2. It is to be noted that each of the IC pads 20 includes an input protection diode 46 and the testing step may take advantage of this structure. That is, a negative voltage, such as minus 3 V, may be applied to each of the pads 20 of the integrated circuit 18 and a known current should be drawn. A low current indicates an open pad, and a high current indicates a shorted pad.

After the individual slices 12 have been assembled and tested, they are then ready for stacking as best seen in FIG. 6. That is, a base heat sink 48 is provided which has connected thereto and insulated therefrom the plurality of signal connection pins 42. The individual slices 12 may then be stacked as the openings 40 may be inserted over the pins 42.

Figure 7:
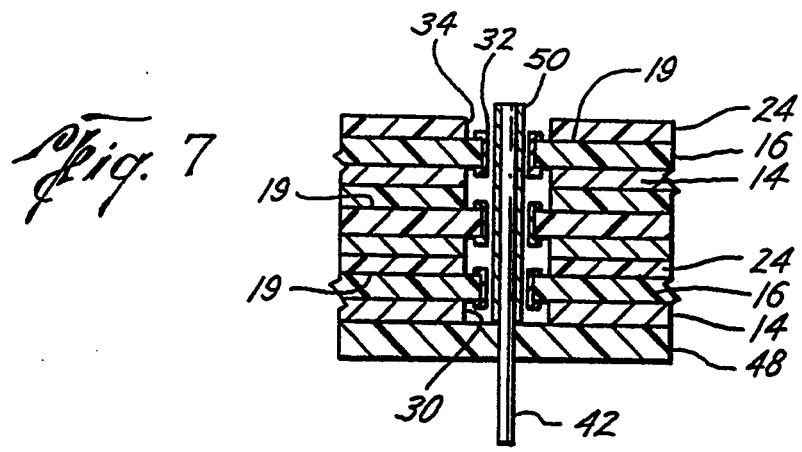
FIG. 7 is a fragmentary enlarged elevational view showing a soldered coated signal pin.
Figure 8:
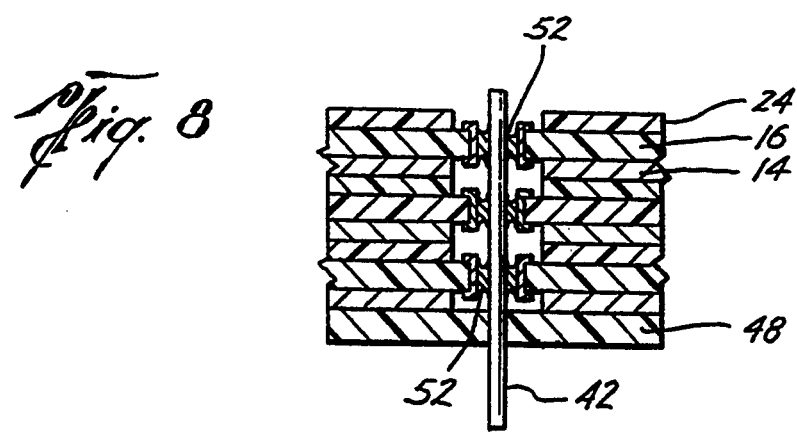
FIG. 8 is a view similar to FIG. 7 after heat has been applied soldering the pin and lead interconnections together.

Referring now to FIG. 7, it is to be noted that the openings 34 in the encapsulation layer 24 and the openings 30 in the metallic layer 14 are preferably larger than the openings 32 in the layer 16. For example only, the openings 40 may be made at a pitch of 100 mils, with openings 30 and 34 having a diameter of 75 mils, while the diameters of the openings 32 are 27 mils (or 24 mils with pasteless solder on the sidewalls) and the diameters of the signal pins 42 are 18 mils (or 24 mils if coated with solder). Because of the difference in size between the openings 30 of the metal layer 14 and of the pins 42, the pins may extend through a plurality of metal layers 14 with the air gap therebetween providing sufficient insulation and providing ease of construction. However, it is desirable that the openings 32 be closer to the outside of the signal pins 42 for ease of connection. After each slice 12 is stacked onto the pins 42, each of the pins 42 is sprayed lightly with a flux 50 to facilitate solder reflow. A light pressure is then applied to the stacked slices 12 to hold the assembly while the pins 42 are heated such as being inserted into a suitable metal heater block (not shown). The pins 42 are then heated causing the solder 50 (whether on each pin 42, in each opening 32, or both) flow and make interconnections, if any, between the pins 42 and the lead interconnections 19 in layers 16. This provides, as best seen in FIG. 8 an electrical connection 52 between the signal pins 42 and the interconnection leads.

Figure 9:
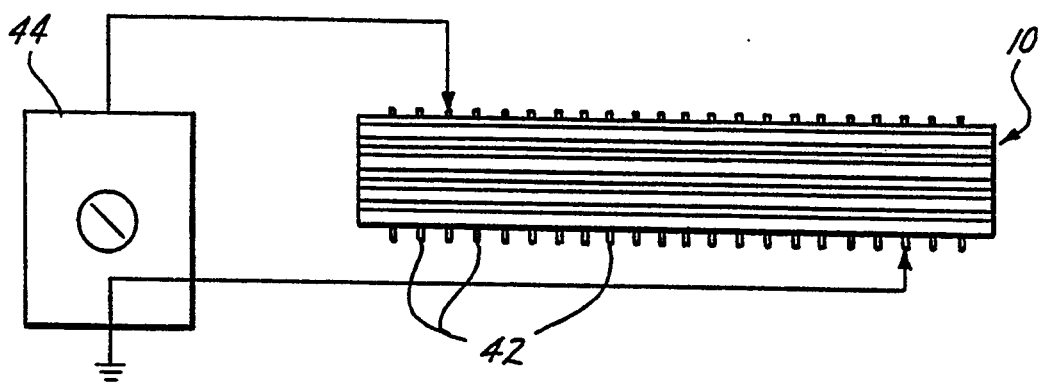
FIG. 9 is an elevational view of a completed module with a schematic test set up for testing the final assembly.

Referring now to FIG. 9, after the module 10 has been assembled and connected to the signal pins 42, it may be tested by suitable testing apparatus 44 which in fact may be a standard test fixture which matches the footprint of the PGA pins 42 to make the necessary electrical contacts needed for complete full speed testing of a module 10. In addition, when the module 10 is assembled, all of the lead networks 19 are available for testing at the pins 42 with no concealed signals or networks. Again, taking advantage of the input protection diodes 46 of the integrated circuit 18 a negative voltage may be applied to each network and a known current should be drawn for each of the networks, indicative of a number of diodes connected to the network. A low current indicates an open pad, a high current indicates a shorted network.

Figure 10:
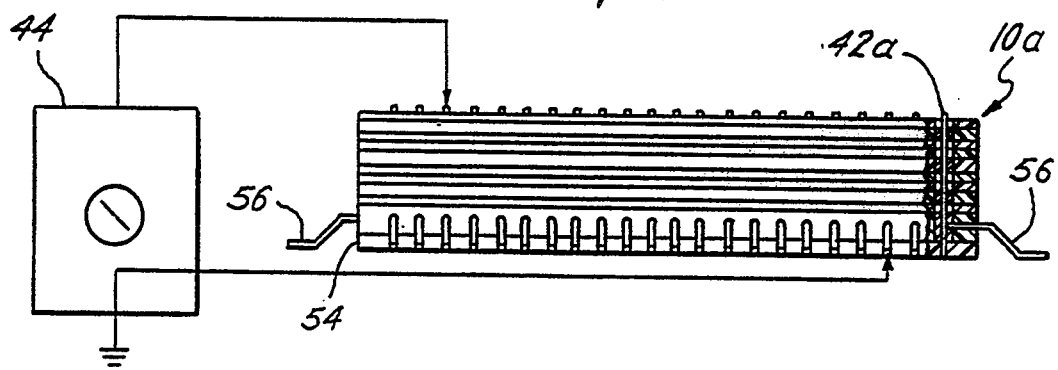
FIG. 10 is a completed module assembly having horizontal extending pins for providing a quad flat pack connection.

Other and further embodiments of the present invention may be provided. As shown in FIG. 10, a module 10a is provided which is generally the same as module 10 with the exception of having a base 54 which in addition to having a plurality of vertical extending signal pins 42a also includes a plurality of horizontally directed pins 56 that provide a conventional footprint for connections with a quad flat pack.

Figure 11:
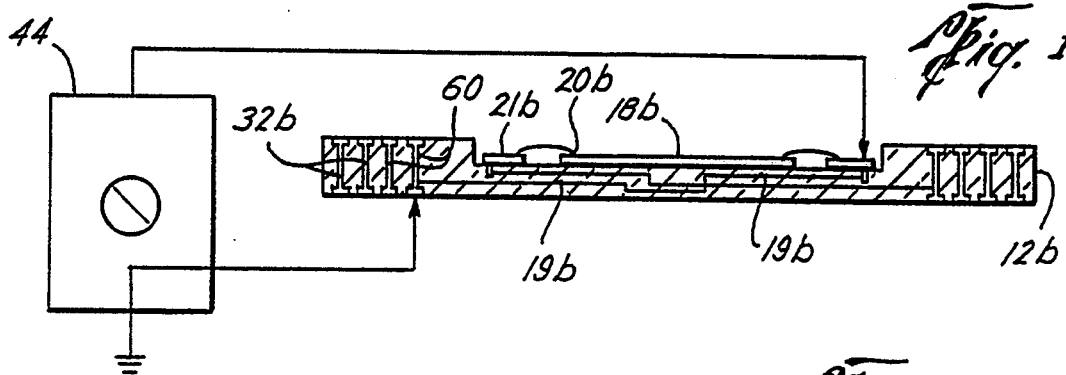
FIG. 11 is a cross-sectional view of another embodiment showing a ceramic slice with lead interconnects and an integrated circuit die with a schematic test set up.
Figure 12:
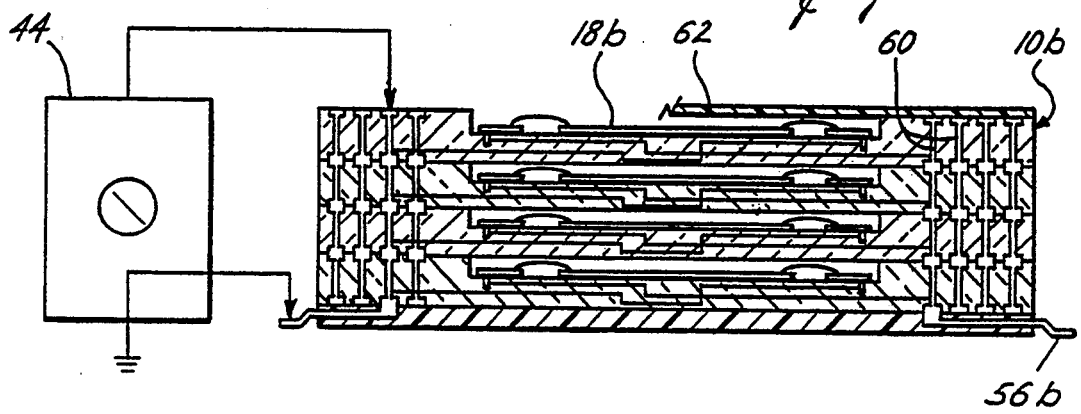
FIG. 12 is an assembly composed of a plurality of the ceramic slices of FIG. 11 which have been bonded together and provided with a schematic test set up.

Referring now to FIGS. 11 and 12, another embodiment of the present invention is used which utilizes a multilayer ceramic slice. Thus, slice 12b is provided having an integrated circuit 18b in which its pads 20b are connected to ends 21b of the lead interconnects 19b in the ceramic slice 12b. The ceramic slice 12b includes a plurality of openings 32b which are filled with solder 60. When a plurality of slices 12b are stacked together and heated the solder reflow creates signal connections vertically through an assembled module as best seen in FIG. 12. The vertical signal connections may also be made using conductive adhesive or conductive tape. Again it is to be noted that the openings 32b through the slice 12b are positioned through, surround, and are closely adjacent to the IC 18b. It is also noted from FIG. 11 that each individual slice 12b may be tested individually and prior to the assembly of the completed three dimensional module 10b.

As also shown in FIG. 12 after assembly of the module 10b it may again be tested by the apparatus 44. While the module 10b shown in FIG. 12 has horizontally extending connections 56b of a quad flat pack, it is to be understood that connections could be directed downwardly to 6 meet a conventional PGA footprint. Also in FIG. 12 a top seal 62 is added to the module 10b after testing.

Figure 13:
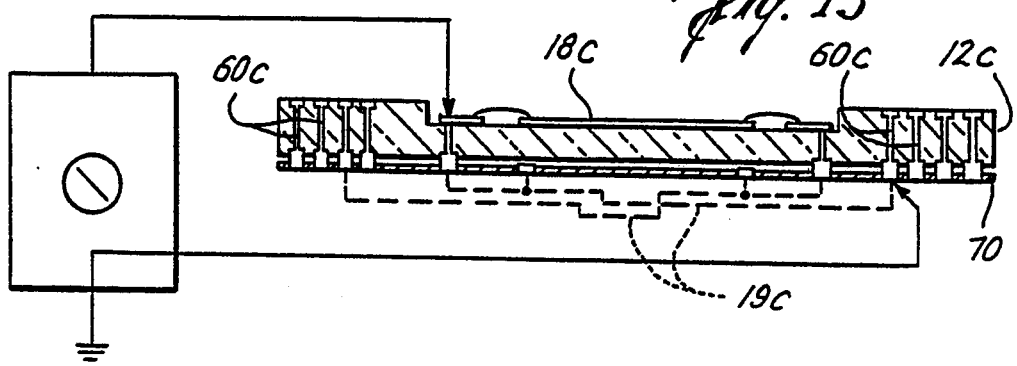
FIG. 13 is an alternate ceramic slice embodiment having a film strip with interconnect leads on the bottom for connecting to the signal connections, but with the traces on the film shown below in dotted lines for clarity.

Referring now to FIG. 13 a further embodiment of a ceramic slice 12c is shown in which instead of having a plurality of lead networks 19b made in the slice 12b, a separate film 70 is provided having a plurality of lead networks 19c which can be easily custom fabricated to make contacts with various signal connections 60c and be soldered thereto during the assembly process.

As before in the other embodiments, each IC 18c is mounted on a custom interconnect slice 12c, tested, then all slices are stacked together with electrical connections from one slice layer 12c to the next slice layer 12c and to the signal connections for connection to other electronic components. In addition, all of the interconnect networks are accessible for testing at the final assembly stage which is an important testability feature not afforded by conventional multi-chip packages. By individually testing each of the components prior to final assembly, the risk and trouble of assembling a multi-chip package with faulty components is minimized.

The present three dimensional IC interconnect modules make use of electrical signal connections surrounding the integrated circuits. The signal connections are assigned to each of the signals to be routed between seperate integrated circuit chips as well as between integrated circuit chips and external package pins. The integrated circuit bond pads are connected to the signal connections using standard patterned metallic traces on a printed circuit board or multi-layer ceramic interconnect. After testing, if any defect is found, the same heating block which was used to electrically connect the solder on each pin to the lead interconnections may be used to remelt the solder joints and disassemble the module for retest and repair.

The method of making the three dimensional IC interconnect modules and the testing of them is apparent from the foregoing description.

The present invention, therefore, is well adapted to carry out the objects and attain the ends and advantages mentioned as well as others inherent therein. While presently preferred embodiments of the invention have been given for the purpose of disclosure, numerous changes and details of construction, arrangement of parts, and steps of the process, will be readily apparent to those skilled in the art which are encompassed within the spirit of the invention and the scope of the appended claims.

What is claimed is:

1. A method of making a three-dimensional IC interconnect module comprising,
    making a plurality of slices having at least one integrated circuit having a plurality of input/output pads and a lead interconnect electrically connected to each pad, said lead interconnects terminating at various locations within the periphery of the slices and surrounding the integrated circuits,
    testing each slice individually to test the integrated circuits and the lead interconnects, stacking said slices together and aligning a plurality of signal connections extending transversely through the plurality of slices within the periphery of the slices and surrounding the integrated circuits, electrically connecting the lead interconnects to the signal connections, and testing the stacked slices through the signal connections.

2. The method of claim 1 including, providing a plurality of openings in each slice, one of said openings positioned adjacent the termination of each lead interconnect, providing a plurality of parallel extending signal connection pins, and stacking said slices together by inserting said openings over the pins.

3. The method of claim 2 including, electrically connecting the lead interconnects to the pins by heating the pins and soldering the interconnects and pins together.

4. The method of claim 1 including the step of testing each slice individually by first testing only the lead interconnects.

5. The method of claim 1 including providing a plurality of solder filled openings in each slice, one of said openings positioned adjacent the termination of each lead interconnect, and heating the stacked together slices for connecting the solder filled openings together forming the signal connections.

6. The method of claim 1 wherein the slices are ceramic and said lead interconnects are formed by placing a film of interconnect circuitry between ceramic slices.

7. The method of claim 1 wherein the slices are formed by assembling a bottom metallic layer, a middle layer having an integrated circuit having a plurality of input/output pads and having a lead interconnect electrically connected to each pad, and a top encapsulation layer, and providing openings in all of said layers within their periphery and surrounding the integrated circuits.

8. The method of claim 1 wherein the integrated circuits have input protection diodes at each pad, and the testing includes, applying a negative voltage to each of the lead interconnects when testing each slice, and measuring the current drawn for each of the interconnects.

9. The method of claim 1 wherein the slices are formed by assembling a bottom heat sink layer, a middle layer having an integrated circuit having a plurality of input/output pads and having a lead interconnect electrically connected to each pad, and a top insulation layer, and providing openings in all of said layers within their periphery and surrounding the integrated circuits.

* * * * *